United States Patent [19]
Smeiman

[11] Patent Number: 4,537,850
[45] Date of Patent: Aug. 27, 1985

[54] PROCESS AND APPARATUS FOR REJUVENATING ELECTROSTATIC COPY MACHINE TONER

[76] Inventor: Wilfred Smeiman, 33372 Bremerton St., Dana Point, Calif. 92629

[21] Appl. No.: 527,699

[22] Filed: Aug. 30, 1983

[51] Int. Cl.[3] ....................... G03G 9/08; G01R 33/12; C22C 19/00

[52] U.S. Cl. .................................... 430/137; 361/143; 361/153; 427/130; 427/444; 148/103; 148/108

[58] Field of Search ................ 430/137; 427/130, 444; 118/623, 602, 657, 658; 361/143, 153; 148/103, 108

[56] References Cited

U.S. PATENT DOCUMENTS

| | | | |
|---|---|---|---|
| 3,523,836 | 8/1970 | Buschow et al. | 148/103 X |
| 3,535,621 | 10/1970 | Ptomey et al. | 361/143 X |
| 4,080,054 | 3/1978 | Watanabe | 118/657 X |
| 4,108,658 | 8/1978 | Koeleman et al. | 118/657 X |
| 4,176,078 | 11/1979 | Lu | 430/903 X |

*Primary Examiner*—John D. Welsh
*Attorney, Agent, or Firm*—Donald D. Mon

[57] ABSTRACT

A method and apparatus for rejuvenating magnetic toner used in certain electrostatic copying machines. The used toner is placed in a container which is inserted in an air coil which is energized to produce a magnetic field which remagnetizes the toner. The coil is provided by mounting a hollow non-magnetic tube in a case and winding this tube with wire. A timing circuit energized by a momentary switch determines the length of time a magnetic field is applied to the toner being recycled.

12 Claims, 4 Drawing Figures

PROCESS AND APPARATUS FOR REJUVENATING ELECTROSTATIC COPY MACHINE TONER

FIELD OF THE INVENTION

This invention relates to toner for use in electrostatic copy machines and more particularly relates to a method and apparatus for rejuvenating used toner.

BACKGROUND OF THE INVENTION

In certain electrostatic copy machines which use magnetic toners, the toner is basically composed of minute magnetite (or some other magnetic material) particles which are coated with a suitable non-conducting synthetic resin. These particles which, in at least one instance, are approximately 10 microns in size and can be magnetized and demagnetized and can be influenced by extraneous magnetic fields. It is a combination of these magnetic and electrostatic properties of the toner which are used to transport and project the toner particles from the toner storage hopper to the electrostatic latent image on the photo-conductive surface of the drum, so that the latent image is thereby developed. The synthetic resin coating is a meltable fusion component and is subsequently used to fuse the toner to the paper after the developed image has been transferred from the drum to the paper. Excess toner on the drum is then discharged into a receptacle for disposal. When the receptacle becomes nearly full, an indicator light will flash telling the operator to remove the receptacle and discard the toner. Such used toner has lost its magnetic charge and is not suitable for reuse in copying.

The amount of the toner disposed of in this manner can be anywhere from 50 to 80 percent of the toner originally put into the machine. Since toner is relatively expensive, this is a costly waste of materials. It would be advantageous if this toner could be reused, but presently there is no method known for rejuvenating and recycling the toner.

It is therefore one object of the present invention to provide a method for rejuvenating toner used in certain electrostatic copy machines.

Yet another object of the present invention is to provide a simple apparatus for rejuvenating used magnetic toner.

Still another object of the present invention is to provide a method of rejuvenating magnetic toner by applying a timed magnetic field to the magnetic toner.

Yet another object of the present invention is to provide a rejuvenator for magnetic toner which remagnetizes the toner.

Still another object of the present invention is to provide an apparatus for rejuvenating magnetic toner which applies a magnetic field to used magnetic toner which is automatically timed.

BRIEF DESCRIPTION OF THE INVENTION

In the method of the present invention magnetic toner, after being used in an electrostatic copy machine, is retrieved from the machine and dumped into a container. The container is then placed inside a large electrical coil. The coil is energized for a predetermined period of time, creating a magnetic field which rejuvenates the toner, allowing it to be recycled for use in an electrostatic copy machine.

An appartus for rejuvenating the magnetic toner comprised of a case having a long tubular plastic core for receiving a container with the toner to be rejuvenated. A large coil is wound around the core and is energized by a half wave cycle DC pulse generating circuit. The pulse generating circuit generates DC pulses at a frequency of approximately 60 pulses per second to rejuvenate toner placed into the hollow core of the case. The rejuvenating circuit includes a timer energized by a momentary switch which times the period of rejuvenation for a period of two to ten minutes with five minutes being preferred.

The rejuvenating circuit has a 120 volt AC input to the timer having its timer period controlled by an RC circuit. If desired, the resistor in the RC circuit can be variable to adjust the time period. The output of the time circuit is rectified by a silicon control rectifier to provide a pulsed DC output of 60 pulses per second. The output is applied to the coil to produce a magnetic field to magnetize and rejuvenate the toner. To prevent the toner from exceeding the fusion temperature of the fusion component, a temperature sensor is provided in the cirucit. If the temperature surrounding the coil shold exceed the design temperature of the temperature sensor, the circuit shuts off preventing the toner from being damaged. The rejuvenating process can be restarted by simply pressing the momentary start switch, after the temperature has decreased sufficiently to permit the temperature sensor or thermostat to reset.

The above and other features of the invention will be more fully understood from the following detailed description and the accompanying drawings, in which:

DETAILED DESCRIPTION OF THE INVENTION

Figure 1:
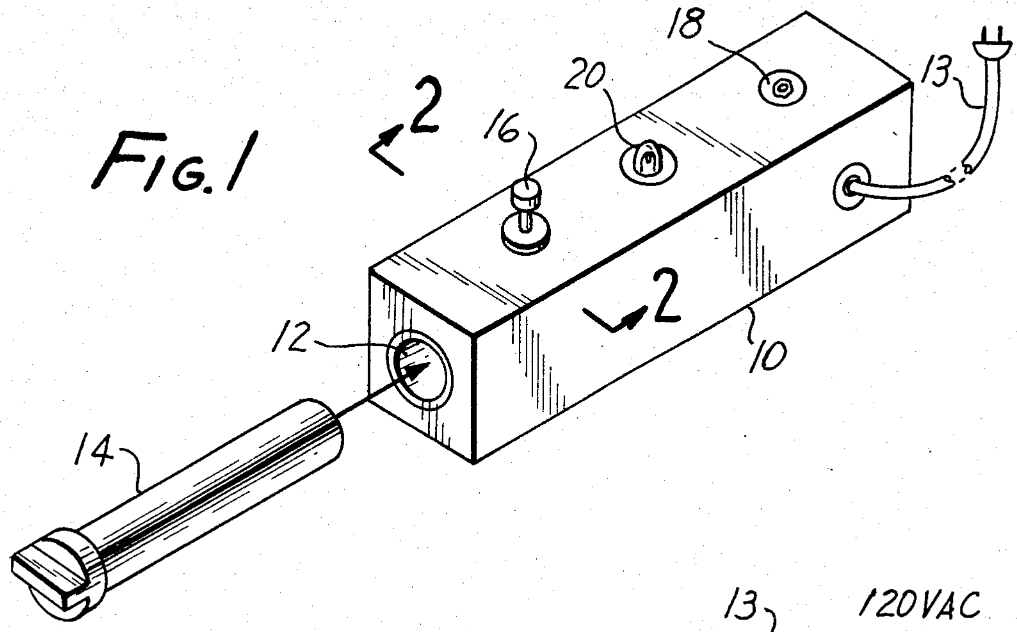
FIG. 1 is a perspective view of a toner rejuvenating apparatus according to the invention.
Figure 3:
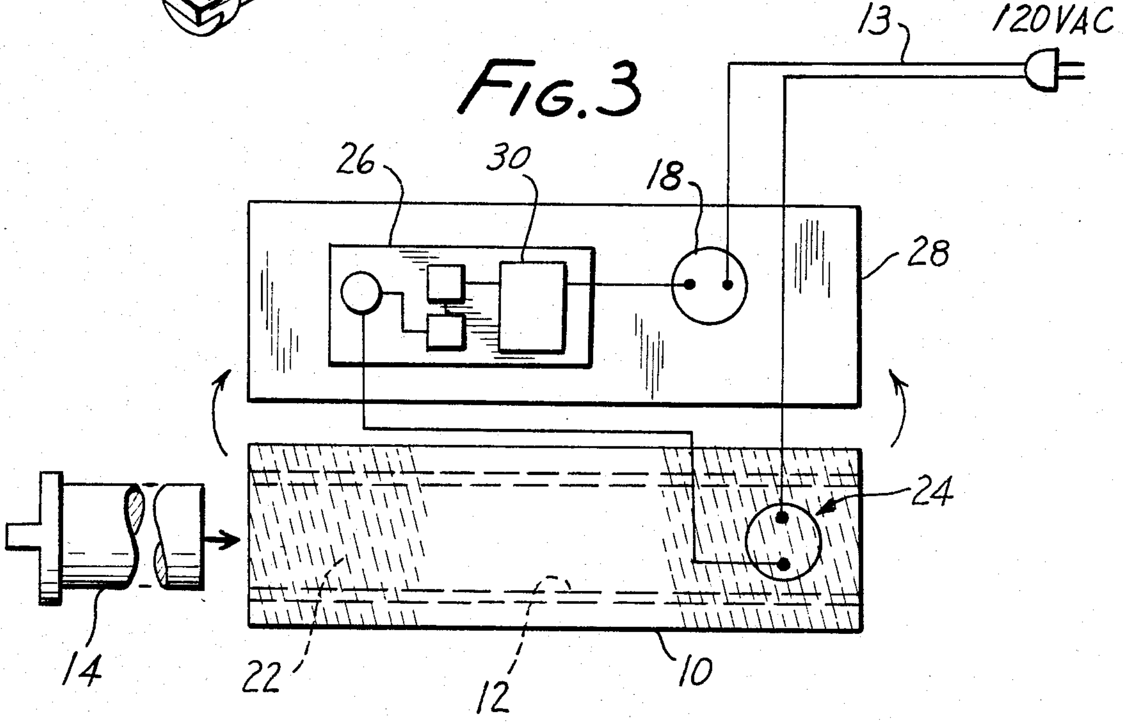
FIG. 3 is a view illustrating the construction of the rejuvenating apparatus according to the invention with the lid removed.
Figure 2:
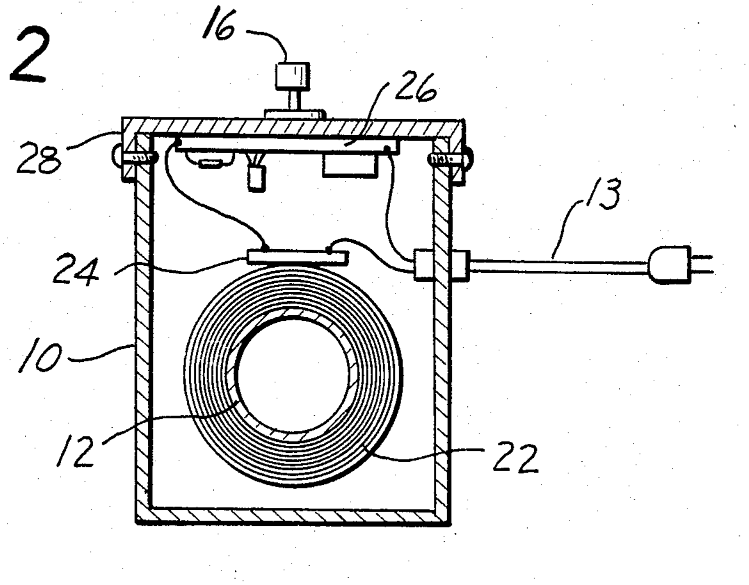
FIG. 2 is a sectional view taken at 2—2 of FIG. 1.

FIGS. 1 and 2 show an apparatus for utilizing the method according to the invention. The rejuvenating apparatus is comprised of a case 10 having a hollow tubular, preferably plastic, core 12 passing through from one end of the case to the other and a cord 13 for application of a 120 VAC power source. The core is hollow to permit a tubular container 14 to be inserted filled with used toner. After inserting the container, momentary switch 16 energizes a circuit for applying a magnetic field to the toner to re-magnetize or recharge it. Also included is a conventional circuit breaker 18 or fuse connected to the 120 VAC input cord 13 and a indicator light 20 to indicate when the circuit is in use. It also will indicate if for some reason the timer should shut off the circuit prematurely, or if temperature sensor 24 has switched off.

The apparatus is shown with the lid removed in FIG. 2 to illustrate the wire coiled 22 tightly wound around core 12. Attached to the coil is a temperature sensor 24 also connected to the 120 VAC input to prevent the temperature of the toner in container 14 from exceeding the fusing temperature of a fusion component in the toner. Preferably this temperature is less than 120°

Farenheit (50° Centigrade). Coil 22 is approximately a 40 to 120 ohm air coil.

The operating circuit is mounted on circuit board 26 attached to cover or lid 28 for closing case 10. Preferably lid 28 is riveted or sealed to prevent tampering. The output of circuit 26 is optimized by an RC circuit which optimizes application of pulses (i.e., magnetic field) through coil 22. This permits the circuit to re-magnetize toner to optimum strength for best possible copy quality. The time of application of the magnetic field to the toner can vary according to the type and volume of toner. With a container full of toner (i.e., approximately 8 ounces) a charge cycle of approximately five minutes should be sufficient to re-magnetize the toner.

Figure 4:
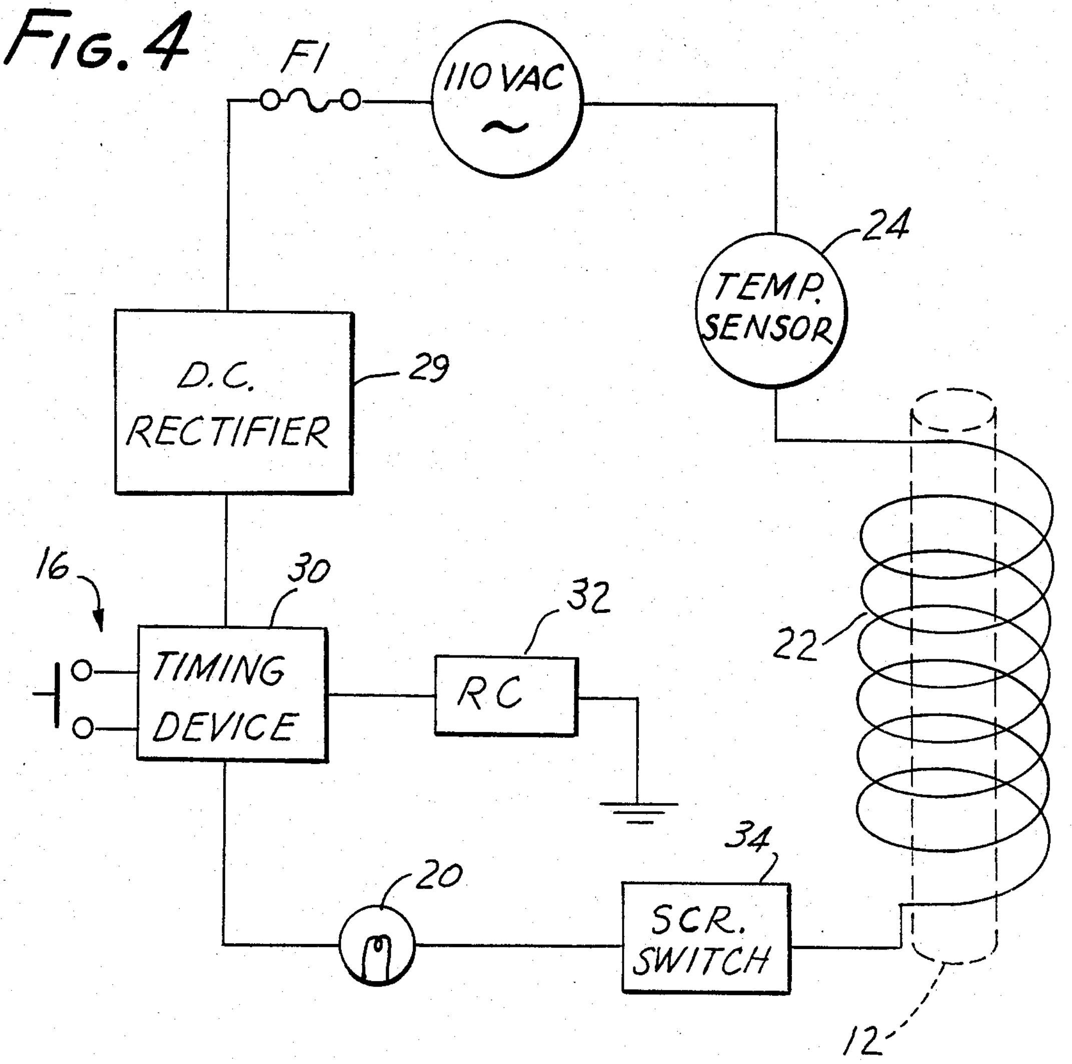
FIG. 4 is a semi-schematic block diagram illustrating operation of the toner rejuvenating apparatus according to the invention.

Circuit 26 is shown in the schematic block diagram of FIG. 4. A 120 volt AC input is provided through circuit breaker F1 and DC rectifier 29 to an integrated circuit timing device 30. The timer is a device known as a 555 timer or its equivalent. Connected to timer 30 is momentary switch 16 for activating the circuit. Also connected to the timer is an RC time delay circuit 32 which permits control of the preselected time set by timer 30. The resistor in the RC circuit delay 32 can be adjustable to optimize cycle time for application of pulses to coil 22 if desired. The output of timer 30 is fed to an indicator lamp 20 and a silicon control rectifier 34 which rectifies the input voltage to produce a pulsed DC output to coil 22 on core 12.

The types of toner which can be rejuvenated by the method of the present invention are those which are made magnetic by means of a substance such as a colloidal solution of magnetic particles which are added during manufacture. Thus, the toner is of the type used in certain electrostatic copy machines and is particularly suitable for recycling. A variety of copiers are available which utilize this type of toner. Once the toner has been used in a copy machine, the magnetic properties are degraded. The degraded toner in the receptacle of the copy machine is retrieved and dumped into a cartridge or container 14 for rejuvenation by the method and apparatus according to the invention. Degraded toner is a disadvantage as it produces poor quality copies, clogs up the machine with toner dust. Additionally, the degraded toner increases servicing of the copy machine substantially. With the rejuvenated toner having the optimum magnetic properties, service calls can be reduced.

To utilize the process and apparatus of the present invention, spent or used toner which has already been cycled through the copier, is removed and placed in a cartridge or container 14. The container is then inserted into the core surrounded by air coil in case 10. Switch 16 is then energized, causing pulses to generate a magnetic field in the coil 22. The coil thus forms an electromagnetic field generating magnetic forces which restore the magnetic properties to the toner.

The time of application of the magnetic field is controlled by the circuit and the IC timer. This, of course, would vary for optimum results according to the amount of toner inserted in the apparatus, but a cycle of four to six minutes and at least three minutes is desired. Preferably the toner should be rejuvenated just prior to placing it in service back into the electrostatic copy machine for optimum results. Discharged toner can be recycled continuously with the decrease in volume of toner which is used up in developing an image being replenished occasionally with fresh toner.

Thus, there has been disclosed a method and apparatus for rejuvenating toner used in certain electrostatic copy machines. The apparatus is simple and easy to use and prevents a substantial waste of expensive toner used in these copy machines.

The invention is not to be limited by the embodiment shown in the drawings and described in the description which is given by way of example and not of limitation, but only in accordance with the scope of the appended claims.

I claim:

1. A process for rejuvenating toner for electrostatic copy machines comprising:

transferring a used toner having magnetic particles coated with a fusible component to a container;

surrounding said container with an electromagnetic coil;

energizing said electromagnetic coil to apply a pulsed magnetic field to said toner;

timing the output of said electromagnetic coil to optimize the application of said pulsed electromagnetic field for optimum magnetic strength of said toner.

2. The process according to claim 1 in which said electrocoil is energized by rectifying means.

3. The process according to claim 2 in which said rectifying means is a half-wave rectifier producing half-wave rectified pulses of a predetermined magnitude and frequency.

4. The process according to claim 1 in which said timing means produces an output from said energizing means for between two to ten minutes.

5. The process according to claim 4 in which said timer produces an output for five minutes.

6. The process according to claim 1 including sensing the temperature proximate said toner; shutting off said energizing means before the temperature approaches the melting point of said fusion component in said toner.

7. Apparatus for rejuvenating toner for electrostatic copy machines comprising:

a hollow core means;

an electromagnetic coil surrounding said hollow core means;

container means containing used toner having magnetic particles coated with a fusible component for placing the toner to be rejuvenated inside said core;

energizing means for energizing said electromagnetic coil to produce a pulsed electromagnetic field to said toner;

timing means for timing the operation of said energizing means to optimize the application of said electromagnetic field for optimum magnetic strength of said toner.

8. Apparatus according to claim 7 in which said timer means comprises; a timer; means for activating said timer; and means for setting the time period of said timer.

9. Apparatus according to claim 7 including temperature sensing means; said temperature sensing means adapted to shut off said energizing means before the temperature reaches the melting point temperature of said fusion component of said toner.

10. Apparatus according to claim 7 in which said timer is an integrated circuit chip; and said activating means comprises a momentary pushbutton switch connected to reset said integrated circuit chip.

11. Apparatus according to claim 8 in which said means for setting said timer comprises an RC circuit connected to said intergrated circuit whereby the selected time is determined by the value of the resistor and capacitor in said RC circuit.

12. Apparatus according to claim 11 in which the resistor in said RC circuit is a potentiometer whereby the selected time may be adjusted.

* * * * *